United States Patent
Nainar et al.

[11] Patent Number: 6,054,901
[45] Date of Patent: Apr. 25, 2000

[54] LOW NOISE PREAMPLIFIER

[75] Inventors: Elangovan Nainar; Yau Kin Joseph Hon, both of Singapore, Singapore; Gerald Lunn, San Jose, Calif.

[73] Assignee: Motorola, Inc., Schaumburg, Ill.

[21] Appl. No.: 08/942,892

[22] Filed: Oct. 2, 1997

[51] Int. Cl.[7] ........................................ H03F 1/14
[52] U.S. Cl. .................................. 330/292; 330/310
[58] Field of Search ............................... 330/292, 300, 330/310, 311, 110, 293; 360/113

[56] References Cited

U.S. PATENT DOCUMENTS

| | | | |
|---|---|---|---|
| 4,061,959 | 12/1977 | Ahmed | 323/1 |
| 4,216,435 | 8/1980 | Ahmed | 330/254 |
| 4,775,842 | 10/1988 | Rumreich | 330/103 |
| 4,851,786 | 7/1989 | Vinn et al. | 330/252 |
| 5,122,915 | 6/1992 | Klein et al. | 360/113 |

*Primary Examiner*—Robert Pascal
*Assistant Examiner*—Henry Choe
*Attorney, Agent, or Firm*—Rennie W. Dover

[57] ABSTRACT

A low-noise wide band preamplifier (10) provides an output voltage signal ($V_O$) corresponding to the variation in resistance of a sensor such as Magneto-resistive (MR) head (4) which is used to read the data stored on a magnetic media. In this preamplifier, a transistor (12) and resistor (13) combination is used to function as a transimpedance amplifier (11) to increase the frequency bandwidth of the preamplifier and reduce the noise. The transimpedance amplifier (11) takes its input from an input transistor (3) coupled between the MR head (4) and a current source (2). A biasing circuit formed by a transconductance amplifier (12) and a capacitor (5) is used to control the input transistor (3) so that the average current passing through the input transistor (3) matches the current provided by the current source (2).

17 Claims, 4 Drawing Sheets

LOW NOISE PREAMPLIFIER

FIELD OF THE INVENTION

This invention relates to a low-noise preamplifier, and more particularly, though not exclusively, to such a preamplifier for magneto-resistive sensors.

BACKGROUND OF THE INVENTION

In a Hard Disk Drive (HDD) system having a Magneto-Resistive (MR) head for reading the data on the disk, the resistance of the MR head varies according to the magnetic field applied to the MR head from the disk. A circuit is required to convert the variation in resistance of the MR head into an output signal. One such type of circuit is a current biased and current sensing preamplifier. Such a preamplifier applies a DC bias voltage across the MR head to achieve a predetermined bias current through the MR head and senses a variation in the current as the resistance varies, i.e. as the magnetic bit cells (representing the data) on the disk pass the MR head. The sensed current variations are converted into an output signal representing the data stored on the disk. Therefore, the functions provided by such a preamplifier include:
biasing the MR head with a predetermined current;
sensing the small AC variations in current; and
converting the variations into a relatively large output signal, usually a voltage signal.

Such an amplifier must be capable of operating at high frequencies, since the amount of data that can be stored on the disk depends on the speed at which the data can be read out, whilst generating as little noise as possible.

BRIEF SUMMARY OF THE INVENTION

Accordingly, the invention provides a low-noise preamplifier comprising:
a current source for providing a current to a magneto-resistive sensor;
an input transistor having a first current electrode coupled to the current source, a second current electrode for coupling to the magneto-resistive sensor and a control electrode;
a biasing circuit coupled between the first current electrode and the control electrode of the input transistor for controlling the average current passing through the input transistor so as to match the current provided by the current source; and
a transimpedance amplifier having a low impedance input coupled to the first current electrode of the input transistor and an output providing a voltage output signal to an output terminal of the preamplifier.

BRIEF DESCRIPTION OF THE DRAWINGS

Preferred embodiments of the invention will now be more fully described, by way of example, with reference to the drawings, of which.

DETAILED DESCRIPTION OF THE DRAWINGS

Figure 1:
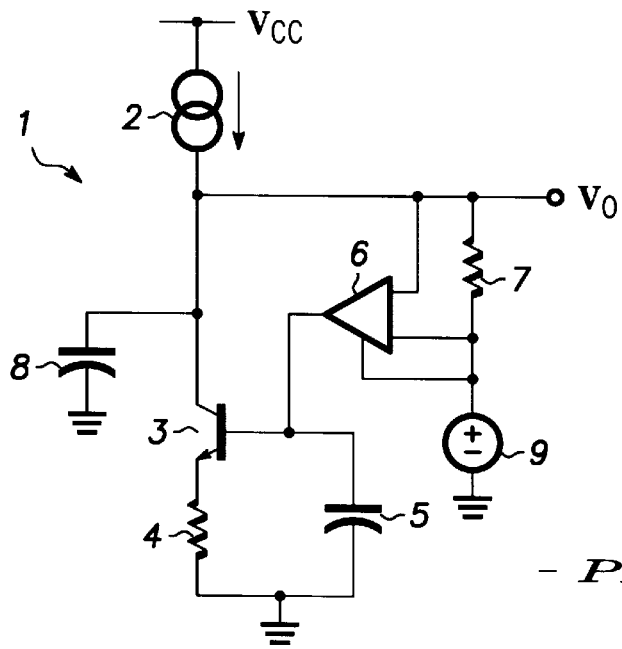
FIG. 1 shows a circuit diagram of a typical prior art preamplifier.

Thus, one known preamplifier 1, similar to one disclosed in U.S. Pat. No. 5,122,915, is shown in FIG. 1. The preamplifier 1 can operate on a 5V supply $V_{cc}$ and includes a constant current source 2, coupled to the collector of an input CMOS transistor 3, whose emitter is coupled to one side of an external MR head, represented by resistor 4. The current source 2 provides a large operating current (approximately 10 mA) to the input transistor 3 as well as biasing the external MR head 4, whose other side is coupled to a ground reference potential GND. The large operating current is required because the change in MR head resistance due to a magnetic field is very small.

An external capacitor 5 is coupled between the base of the transistor 3 and the ground reference potential GND. An output of a transconductance amplifier 6 is also connected to the base of the transistor 3 and, together with the capacitor 5, provides a constant voltage potential to the MR head 4. This network is thus a lowpass filter which is connected in the feedback path of the preamplifier 1. A reference voltage source 9 is coupled between ground GND and the transconductance amplifier 6 to provide a constant predetermined reference voltage to the amplifier 6. The frequency response of the preamplifier 1 has a bandpass characteristic in which the lower cutoff frequency is determined by the transconductance $g_m$ of the amplifier 6 and the value of the external capacitor (approximately 10–50 nF). For an input signal whose frequency is higher than the lower cutoff frequency of the preamplifier 1, the voltage across the MR head is constant. Therefore, a change in MR head resistance due to the magnetic field will cause a change in MR head current. This ac current is then converted into a voltage signal by an output resistor 7, which is coupled across the positive and negative inputs of the transconductance amplifier 6. The resistance $R_X$ of the output resistor 7 is arranged to be higher than the resistance $R_{MR}$ of MR head resistor 4, so that the voltage gain of the preamplifier 1 is approximately:

$$\text{Gain} = \frac{R_X}{R_{MR} + \frac{1}{g_M}}$$

Where $g_M$ is the transconductance of the input transistor 3. The upper cutoff frequency, which will determine the maximum input signal frequency is approximately:

$$\text{Bandwidth} = \frac{1}{2\pi R_X C_P}$$

Where $C_P$ is the sum of the parasitic capacitances at the drain of the input transistor 3 as represented by capacitor 8 in FIG. 1. Thus, it can be seen that the product:

(Gain)×(Bandwidth)

is limited by the parasitic capacitance $C_P$, which can be as much as 10–20 pF. To increase the bandwidth, the gain of the amplifier would have to be reduced, but in a functional system, in order to have a better signal to noise ratio, the gain of the first stage should have high gain. Furthermore, the size of the input transistor 3 should be large to introduce less noise, but a larger size input transistor will have a larger parasitic capacitance.

Figure 2:
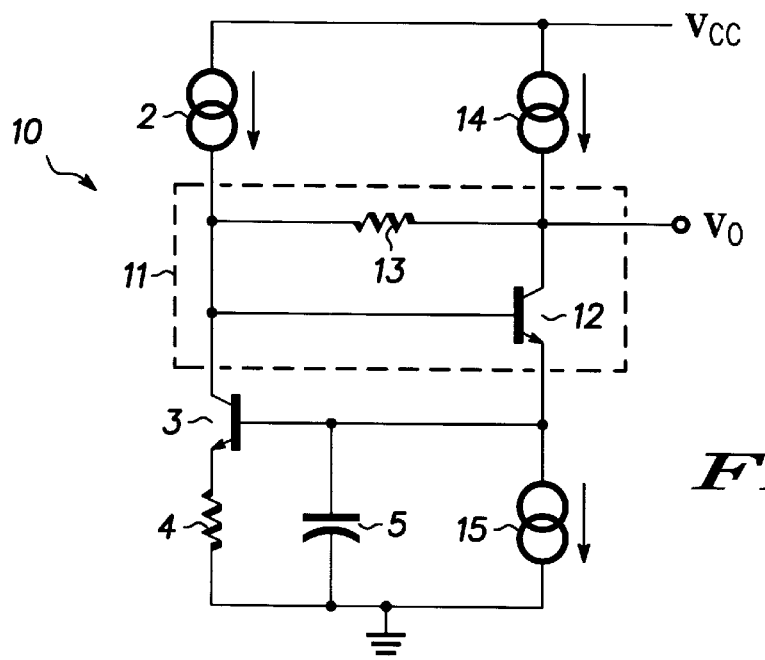
FIG. 2 shows a circuit diagram of one embodiment of the invention.

Therefore, as shown in FIG. 2, a preamplifier 10 according to one embodiment of the present invention, includes the same supply voltage source $V_{cc}$, current source 2, input transistor 3, external MR head represented by resistor 4 and external capacitor 5 as in the prior art circuit described above with reference to FIG. 1. The input transistor 3 is an NPN bipolar type, but, alternatively, an NMOS transistor can be used. As before, the emitter of input transistor 3 is connected to the MR head resistor 4, the other end of MR head resistor 4 being coupled to ground GND and the constant current source 2 biases the MR head resistor 4 via the transistor 3.

The preamplifier 10 further comprises a transimpedance amplifier 11 formed by an NPN bipolar transistor 12 and an output load resistor 13. The load resistor 13 is connected between the collector and base of transistor 12. The collector of transistor 3 is connected to the base of transistor 12. The input node of the transimpedence amplifier 11 is at the collector of transistor 3 and the output node is at the collector of transistor 12. The transimpedence amplifier 11 converts the input current into an output voltage. The ratio between the output voltage and the input current is approximately equal to the value $R_{13}$ of the load resistor 13. The input impedance of the transimpedance amplifier is approximately equal to:

$$(1/gm_{12})+(R_{13}/gm_{12}*R_{12})$$

where $R_{12}$ is the equivalent output impedance of transistor 12;

and $gm_{12}$ is the transconductance of transistor 12. If $R_{12}>>R_{13}$, the second term of the expression can be neglected and the input impedance is $1/gm_{12}$. Since this input impedance is very small, the frequency bandwidth can be very large. The upper cutoff frequency is determined by the parasitic capacitance $C_P$ at the collector of transistor 3 and is equal to $gm_{12}/2\pi C_P$. In this case the bandwidth is independant of the value of $R_{13}$ and thus independant of the gain of the amplifier 10. This relation is true for the first order calculation, when $R_{12}>>R_{13}$. Another advantage of including a transimpedance amplifier is its low output impedance, which means that the input parasitics of subsequent stages will not affect the bandwidth.

The base of transistor 3, is connected to the emitter of transistor 12. This is equivalent to having a transconductance amplifier connected to the base of transistor 3. Bias current sources 14 and 15 are coupled between upper and lower supply voltage lines $V_{CC}$ and GND and the collector and emitter, respectively, of the transistor 12. The transistor 12 and capacitor 5 provide a dc bias for transistor 3. The combination of the transconductance amplifier and the capacitor 5 form a low pass filter. Since this low pass filter is connected in the feedback path, in the overall frequncy response of the preamplifier 10, it acts as a high pass filter and provides a low cut off frequency of the bandpass characterisics of the preamplifier 10. The pole frequency is a function of the value of capacitor 5 and the transconductance of the transconductance amplifier, i.e. transistor 12.

The input noise of the preamplifier 10 is also very small. The noise is mainly generated by the current source 2 and the shot noise generated in transistor 3 due to its collector current. Since the input impedance of the transimpedance amplifier 11 is very small, the voltage noise generated in the gain stage is very small. The only noise to be added is due to the base current of the gain stage, and this value is very small. Thus, due to the simplicity of the circuit, there are fewer noise generating elements in this preamplifier 10 than in the prior art circuits.

Thus, the preamplifier 10 converts small variations in the value of the resistance of the magnetoresistive sensor (represented by resistor 4 in FIG. 1), in response to the varying magnetic field from the magnetic transitions imprinted on the moving magnetic media being read by the MR head, into a larger voltage signal at the output node $V_{OUT}$.

Figure 3:
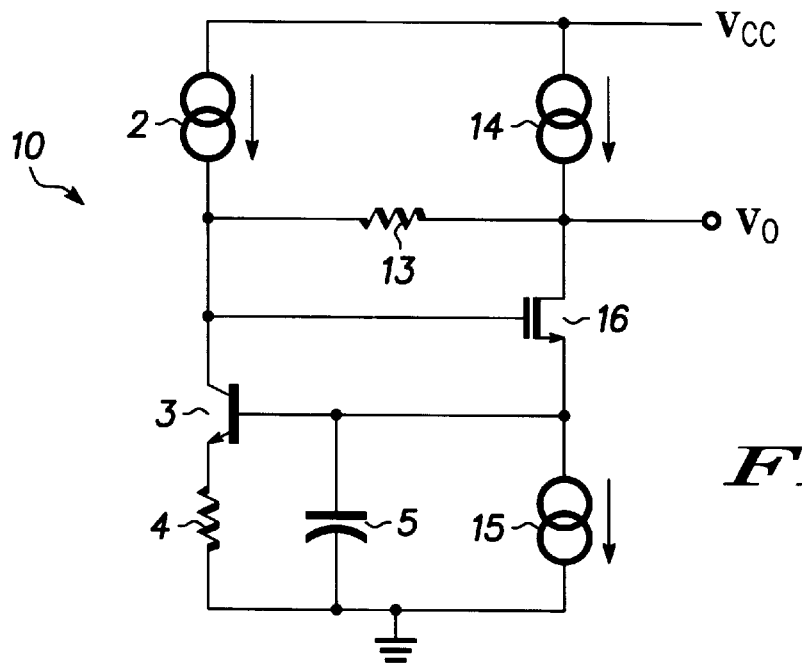
FIG. 3 shows a circuit diagram of a first alternative embodiment to that of FIG. 2.

It will be apparent that transistor 12 can be replaced by a MOS transistor 16, as shown in the embodiment illustrated in FIG. 3, where all elements identical to those in FIG. 2 have the same reference numeral. In this embodiment, the only difference is that NPN transistor 12 is replaced by NMOS transistor 16.

Figure 4:
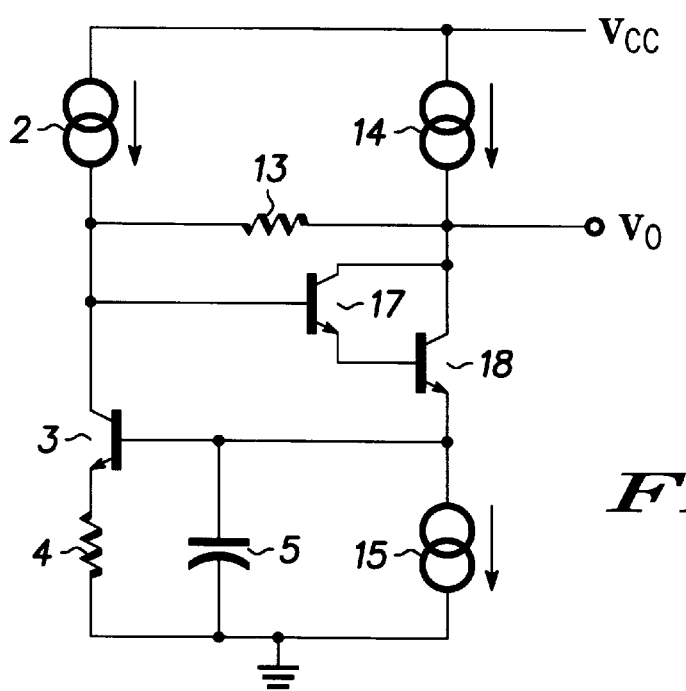
FIG. 4 shows a circuit diagram of a second alternative embodiment to that of FIG. 2.

A further embodiment of the invention is shown in FIG. 4, in which embodiment the transistor 12 of FIG. 2 is replaced by a Darlington pair arrangement of transistors 17 and 18, in which the base of transistor 17 is coupled to the collector of transistor 3, the emitter of transistor 17 is coupled to the base of transistor 18, whose emitter is coupled to the capacitor 5, and the collectors of both transistors 17 and 18 are coupled together and to the output $V_O$. The transimpedance amplifier is now formed by transistors 17 and 18 and load resistor 13. Due to the very high gain of the Darlington pair arrangement, the input impedance will be much smaller than the implementation of the preamplifier 11 shown in FIG. 2.

Figure 5:
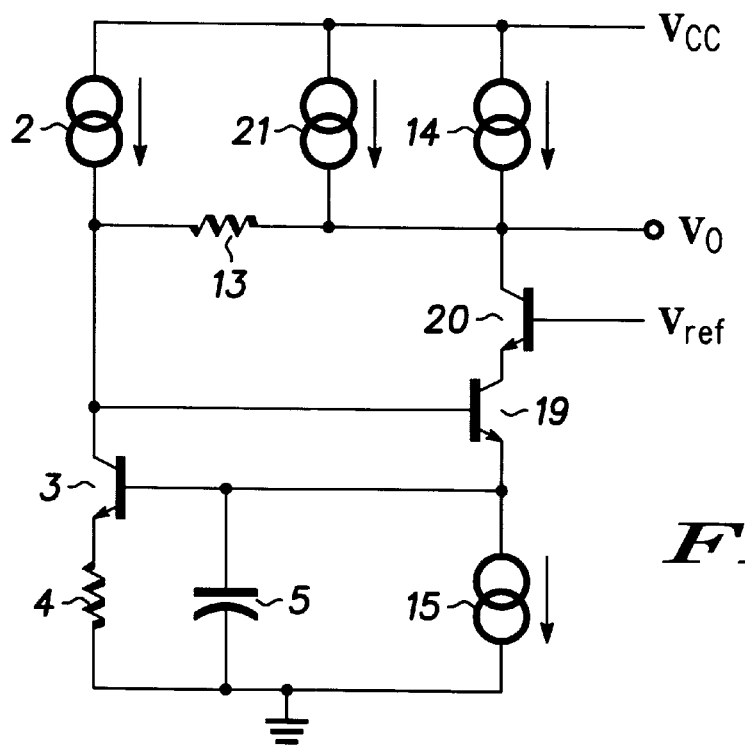
FIG. 5 shows a circuit diagram of a third alternative embodiment to that of FIG. 2.

A still further alternative embodiment is shown in FIG. 5, where the transistor 12 is replaced by a cascode arrangement formed by transistors 19 and 20, where transistor 19 has its base connected to the collector of transistor 3, the emitter of transistor 19 is coupled to the capacitor 5 and the collector of transistor 19 is coupled to the emitter of transistor 20, whose collector is coupled to the output $V_O$ and whose base is coupled to receive a reference voltage $V_{ref}$. This cascode arrangement reduces the parasitic capacitance caused by transistor 12 in the embodiment shown in FIG. 2. However, in this implementation, a higher biasing current is required for the cascode arrangement, so a further bias current source 21 is illustrated coupled in parallel with bias current source 14.

Figure 6:
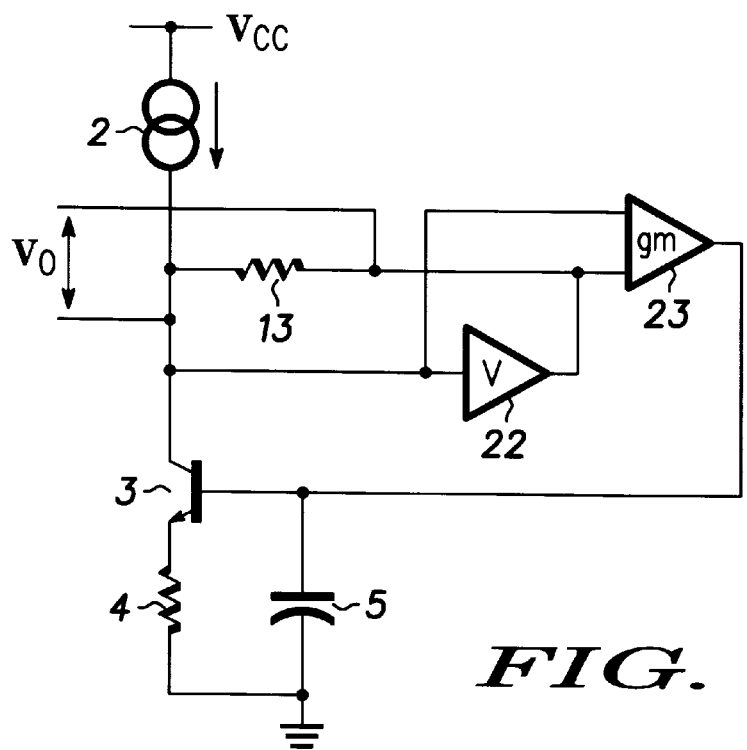
FIG. 6 shows an alternative representation, in a more generalized form, of the embodiment of FIG. 2.

Another way to consider the preamplifier is to look at the transimpedance amplifier 11 of FIG. 2 as being formed by the resistor 13 and a voltage amplifier 22, with a low pass filter formed by a transconductance amplifier 23 and capacitor 5 being provided in a feedback loop to control the dc bias voltage on the base of transistor 3. As shown in FIG. 6, in one such embodiment, the voltage amplifier 22 has a single input coupled to the collector of transistor 3 and an output coupled to one input of a differential transconductance amplifier 23, which input is also coupled to one side of load resistor 13. The other side of load resistor 13 is coupled to the collector of transistor 3, as before. The other input of transconductance amplifier 23 is coupled to the collector of transistor 3 and the output of transconductance amplifier 23 is coupled to the base of transistor 3 and capacitor 5. A differential output $V_O$ of the preamplifier is taken across the load resistor 13.

Thus, the transconductance amplifier 23 takes as its inputs the voltage input and voltage output of the voltage amplifier 22 and is therefore measuring the voltage across load resistor 13, which is proportional to the current through load resistor 13. The dc voltage feedback loop from the output of transconductance amplifier 23 to the base of transistor 3 therefore controls the current through transistor 3 so that current through load resistor 13 is zero so that the current through transistor 3 and the current from current source 2 are the same, which is the required situation.

Figure 7:
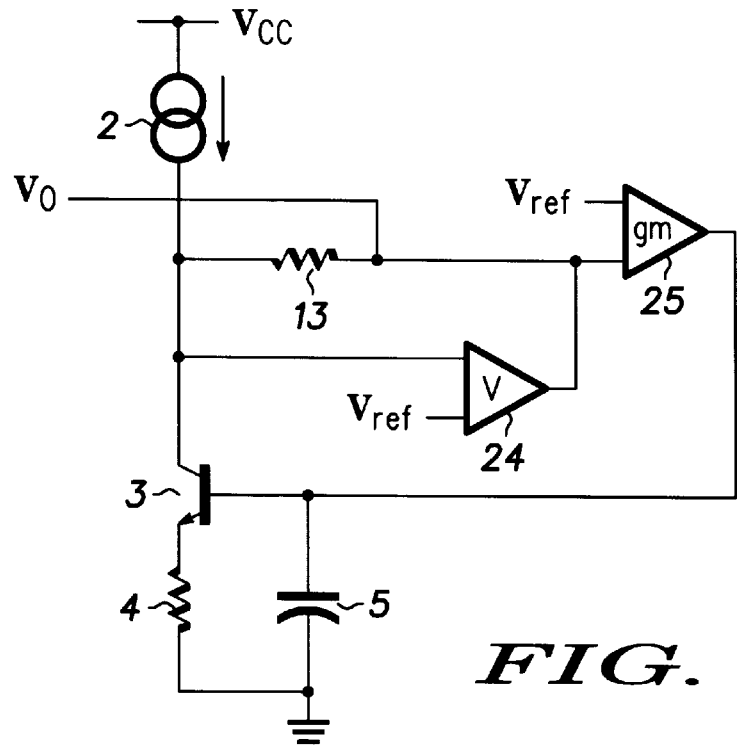
FIG. 7 shows a block circuit diagram of a first alternative embodiment to that of FIG. 6.

Different configurations are possible for the connection of the input of both the voltage amplifier and the transconductance amplifier. The voltage amplifier input can be single ended or differential. If a differential input voltage amplifier 24 is used, as shown in FIG. 7, one input is coupled to the collector of transistor 3 and the other input is connected to a reference voltage $V_{ref}$. In this case, the other input of transconductance amplifier 25 is coupled to the reference voltage $V_{ref}$, instead of to the input of the voltage amplifier, as in the embodiment shown in FIG. 6. Thus, the d.c. input to the transconductance amplifier 25 has a voltage which will be the same as $V_{ref}$ when the circuit has settled. At this time, the current through load resistor 13 is zero and, again, the current through transistor 3 and the current from current source 2 are the same. The output $V_O$ is again taken at the end of resistor 13 which is coupled to the transconductance amplifier 25.

Figure 8:
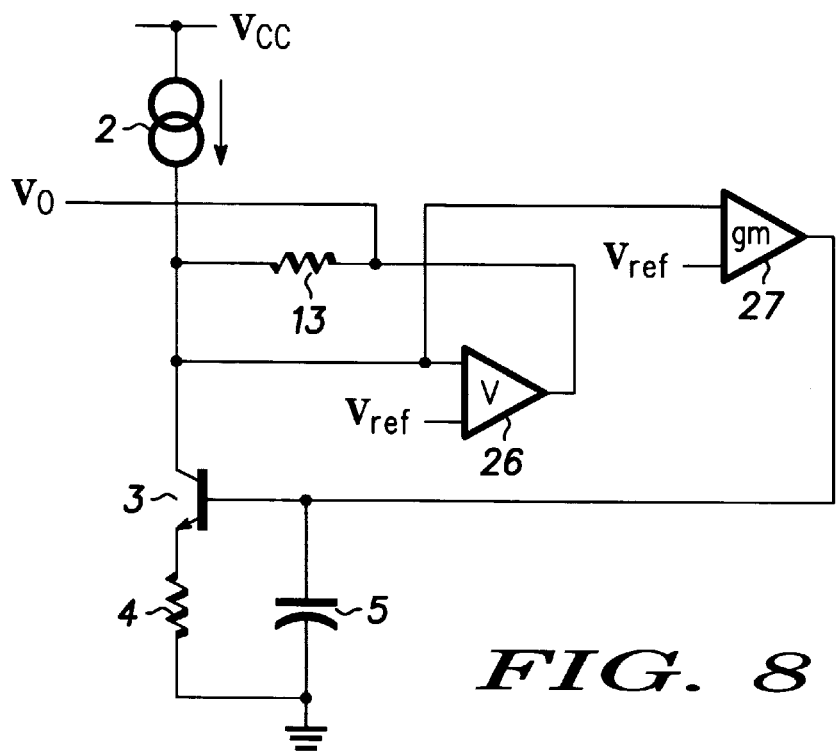
FIG. 8 shows a block circuit diagram of a second alternative embodiment to that of FIG. 6.

Yet another configuration is shown in FIG. 8, in which the inputs of the voltage amplifier 26 are connected in the same way as those of voltage amplifier 24 in FIG. 7. The output of the voltage amplifier 26, however, is coupled to the load resistor 13 and the other input of transconductance amplifier 27 is now coupled to the collector of transistor 3. The transconductance amplifier 27 thus detects the voltage at the collector of transistor 3 and, provided that $V_{ref}$ is suitably chosen, then, again, the current through transistor 3 and the current from current source 2 are the same.

In the embodiments of the invention described above, therefore, the transfer function between the output voltage and the input current is approximately equal to the value $R_{13}$ of the load resistor 13. The input impedance of the transimpedance amplifier is the value of load resistor 13 divided by the loop gain of the transimpedance amplifier. Thus the Gain * Bandwidth product of this preamplifier is increased by a factor equal to the loop gain of the transimpedance amplifier.

Another advantage of the introduction of the transimpedance amplifier is the low output impedance. This means that the parasitics of any subsequent stage will not affect the bandwidth significantly. Furthermore, since the transistor used in the transimpedance amplifier provides the bias for the input transistor, it functions as a transconductance amplifier, so there is no need for another transconductance amplifier to bias the input transistor.

It will be appreciated that although only some particular embodiments of the invention have been described in detail, various other modifications and improvements can be made by a person skilled in the art without departing from the scope of the present invention.

We claim:

1. A low-noise preamplifier comprising:
   a current source for providing a current to a magneto-resistive sensor;
   an input transistor having a first current electrode coupled to the current source, a second current electrode for coupling to the magneto-resistive sensor and a control electrode;
   a biasing circuit coupled between the first current electrode and the control electrode of the input transistor for controlling the average current passing through the input transistor so as to match the current provided by the current source; and
   a transimpedance amplifier having a low impedance input coupled to the first current electrode of the input transistor and an output providing a voltage output signal to an output terminal of the preamplifier, wherein the transimpedance amplifier comprises a gain stage having an input and an output coupled to the output terminal and a load resistor coupled between the input and the output of the gain stage, and wherein the gain stage comprises a voltage amplifier.

2. A low-noise preamplifier according to claim 1, wherein the biasing circuit comprises a transconductance amplifier having an input for receiving a voltage indicating a difference between the current at the first current electrode of the input transistor and the current provided by the current source, and an output coupled to the control electrode of the input transistor.

3. A low-noise preamplifier according to claim 2, wherein the biasing circuit further comprises a capacitor coupled between the control electrode of the input transistor and a ground reference potential.

4. A low-noise preamplifier according to claim 1, wherein the voltage amplifier comprises a transistor having a control electrode coupled to the first current electrode of the input transistor, a first current electrode coupled to the output terminal and a second current electrode coupled to the control electrode of the input transistor, whereby the transistor also forms part of the biasing circuit.

5. A low-noise preamplifier according to claim 2, wherein the transistor is an NPN bipolar transistor having its base coupled to the control electrode of the input transistor, its collector coupled to the output terminal and its emitter coupled to the control electrode of the input transistor.

6. A low-noise preamplifier according to claim 2, wherein the transistor is an NMOS transistor having its gate coupled to the control electrode of the input transistor, its drain coupled to the output terminal and its source coupled to the control electrode of the input transistor.

7. A low-noise preamplifier according to claim 4 wherein the voltage amplifier comprises a further transistor coupled between the control electrode of the transistor and the first current electrode of the input transistor in a Darlington pair arrangement.

8. A low-noise preamplifier according to claim 7, wherein the further transistor has a control electrode coupled to the first current electrode of the input transistor, an emitter coupled to the control electrode of the transistor and a collector coupled to the first current electrode of the transistor and to the output terminal.

9. A low-noise preamplifier according to claim 4 wherein the voltage amplifier comprises a further transistor coupled between the first current electrode of the transistor and the output terminal in a cascode arrangement.

10. A low-noise preamplifier according to claim 9, wherein the further transistor has a control electrode for receiving a reference voltage, an emitter coupled to the first current electrode of the transistor and a collector coupled to the output terminal.

11. A low-noise preamplifier according to claim 2, wherein the transconductance amplifier has a differential input of which one differential input is coupled to the input of the gain stage and the other differential input is coupled to the output of the gain stage, with the voltage output signal being a differential signal taken across the load resistor.

12. A low-noise preamplifier according to claim 2, wherein the gain stage has a differential input of which one differential input is coupled for receiving a reference voltage and the other differential input is coupled to the first current electrode of the input transistor, and the transconductance amplifier has a differential input of which one differential input is coupled for receiving the reference voltage and the other differential input is coupled to the output of the gain stage.

13. A low-noise preamplifier according to claim 2, wherein the gain stage has a differential input of which one differential input is coupled for receiving a reference voltage and the other differential input is coupled to the first current electrode of the input transistor and the transconductance amplifier has a differential input of which one differential input is coupled for receiving the reference voltage and the other differential input is coupled to the other differential input of the gain stage.

14. A low-noise preamplifier according to claim 1, wherein the biasing circuit comprises a transconductance amplifier having an input for receiving a voltage indicating a difference between the current at the first current electrode of the input transistor and the current provided by the current source, and an output coupled to the control electrode of the input transistor.

15. A low-noise preamplifier according to claim 14, wherein the transconductance amplifier comprises an NPN bipolar transistor its base coupled to the control electrode of the input transistor, its collector coupled to the output terminal, and its emitter coupled to the control electrode of the input transistor.

16. A low-noise preamplifier according to claim 14, wherein the biasing circuit further comprises a capacitor coupled between the control electrode of the input transistor and a ground reference potential.

17. A low-noise preamplifier according to claim 14, wherein the transconductance amplifier comprises an NMOS transistor having its gate coupled to the control electrode of the input transistor, its drain coupled to the output terminal, and its source coupled to the control electrode of the input transistor.

* * * * *